US011977115B2

(12) United States Patent
Ru et al.

(10) Patent No.: US 11,977,115 B2
(45) Date of Patent: May 7, 2024

(54) PATTERN GENERATION SYSTEM WITH PIN FUNCTION MAPPING

(71) Applicant: YANGTZE MEMORY TECHNOLOGIES CO., LTD., Wuhan (CN)

(72) Inventors: Feng Ru, Wuhan (CN); Xiang Xu, Wuhan (CN); Yangyang Zhang, Wuhan (CN); Mengda Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 558 days.

(21) Appl. No.: 17/307,902

(22) Filed: May 4, 2021

(65) Prior Publication Data

US 2022/0317185 A1    Oct. 6, 2022

Related U.S. Application Data

(63) Continuation of application No. PCT/CN2021/083836, filed on Mar. 30, 2021.

(51) Int. Cl.
    *G01R 31/317* (2006.01)
(52) U.S. Cl.
    CPC . *G01R 31/31722* (2013.01); *G01R 31/31707* (2013.01); *G01R 31/31718* (2013.01)
(58) Field of Classification Search
    CPC ........ G01R 31/31722; G01R 31/31707; G01R 31/31718; G01R 31/31919; G11C 29/48;
    (Continued)

(56) References Cited

U.S. PATENT DOCUMENTS 5,432,797 A * 7/1995 Takano ............ G01R 31/31919
                                              714/724
2018/0019023 A1    1/2018 Han

FOREIGN PATENT DOCUMENTS

CN    111078156 A    4/2020
CN    111078582 A    4/2020
(Continued)

OTHER PUBLICATIONS

International Search Report issued in corresponding International Application No. PCT/CN2021/083836 dated Dec. 30, 2021, 4 pages.

*Primary Examiner* — Alexander Satanovsky
*Assistant Examiner* — Asm Fakhruddin
(74) *Attorney, Agent, or Firm* — BAYES PLLC

(57) ABSTRACT

In certain aspects, a pattern generation system includes a pattern generator, a memory, a pin function register, a pin function mapper, and a set of source selectors. The pattern generator generates a plurality of source patterns. The memory stores a lookup table set. The lookup table set describes a mapping relationship between the plurality of source patterns and a set of test channels, and is indexed based on a pin function index. The pin function register stores a value of the pin function index. The pin function mapper executes a pin-mapping operation to generate a set of source selection signals based on the value of the pin function index and the lookup table set. Each source selector selects and outputs a source signal from the plurality of source patterns to a corresponding test channel based on a corresponding source selection signal received from the pin function mapper.

20 Claims, 10 Drawing Sheets

(58) Field of Classification Search
CPC ...... G11C 2029/5602; G11C 29/56004; G11C 29/1201; G11C 29/38
See application file for complete search history.

(56) References Cited

FOREIGN PATENT DOCUMENTS

| | | | | |
|---|---|---|---|---|
| CN | 111128289 A | | 5/2020 | |
| CN | 107885681 B | * | 10/2020 | ......... G06F 13/4022 |
| KR | 100974669 B1 | * | 8/2010 | ............. G11C 29/56 |
| WO | WO2000040986 A1 | * | 7/2000 | ............. G01R 31/28 |
| WO | 2004030034 A3 | | 4/2004 | |

* cited by examiner

TABLE 1: LOOKUP TABLE FOR TEST CHANNEL 126A

| | | PIN FUNCTION INDEX | | | | | |
|---|---|---|---|---|---|---|---|
| | | 0 | 1 | 2 | 3 | 4 | 5 |
| SOURCE PATTERN | DATA BIT[0] | 1 | 0 | 0 | 0 | 0 | 0 |
| | DATA BIT[1] | 0 | 1 | 0 | 0 | 0 | 0 |
| | CS BIT[0] | 0 | 0 | 1 | 0 | 0 | 0 |
| | CS BIT[1] | 0 | 0 | 0 | 1 | 0 | 0 |
| | ADD. BIT[0] | 0 | 0 | 0 | 0 | 1 | 0 |
| | ADD. BIT[1] | 0 | 0 | 0 | 0 | 0 | 1 |

TABLE 2: LOOKUP TABLE FOR TEST CHANNEL 126N

| | | PIN FUNCTION INDEX | | | | | |
|---|---|---|---|---|---|---|---|
| | | 0 | 1 | 2 | 3 | 4 | 5 |
| SOURCE PATTERN | DATA BIT[0] | 0 | 0 | 1 | 0 | 0 | 0 |
| | DATA BIT[1] | 0 | 1 | 0 | 0 | 0 | 0 |
| | CS BIT[0] | 1 | 0 | 0 | 0 | 0 | 0 |
| | CS BIT[1] | 0 | 0 | 0 | 1 | 0 | 0 |
| | ADD. BIT[0] | 0 | 0 | 0 | 0 | 1 | 0 |
| | ADD. BIT[1] | 0 | 0 | 0 | 0 | 0 | 1 |

FIG. 5

PATTERN GENERATION SYSTEM WITH PIN FUNCTION MAPPING

CROSS-REFERENCE TO RELATED APPLICATIONS

This application is continuation of International Application No. PCT/CN2021/083836, filed on Mar. 30, 2021, entitled "PATTERN GENERATION SYSTEM WITH PIN FUNCTION MAPPING," which is hereby incorporated by reference in its entirety.

BACKGROUND

The present disclosure relates to a pattern generation system and a method for providing source signals to test channels in a test equipment.

A test equipment can organize a test for a device under test (DUT) into a set of successive test cycles, and perform test activities for the DUT during each test cycle. The test equipment can include a set of test channels, with each test channel coupled to a pin of the DUT. During each test cycle, the test equipment supplies a source signal to each test channel, so that each test channel can drive a corresponding pin of the DUT to carry out a test activity at the corresponding pin based on the source signal.

SUMMARY

In one aspect, a pattern generation system includes a pattern generator, a memory, a pin function register, a pin function mapper, and a set of source selectors. The pattern generator is configured to generate a plurality of source patterns. The memory is configured to store a lookup table set. The lookup table set describes a mapping relationship between the plurality of source patterns and a set of test channels, and is indexed based on a pin function index. The pin function register is configured to store a value of the pin function index. The pin function mapper is coupled to the memory and the pin function register, and is configured to execute a pin-mapping operation included in an instruction to generate a set of source selection signals based on the value of the pin function index and the lookup table set. The set of source selectors is coupled to the pattern generator, the pin function mapper, and the set of test channels. Each source selector is configured to select and output a source signal from the plurality of source patterns to a corresponding test channel based on a corresponding source selection signal received from the pin function mapper.

In another aspect, a pattern generation system includes a memory, a pin function register, and a processor. The memory is configured to store a lookup table set. The lookup table set describes a mapping relationship between a plurality of source patterns and a set of test channels, and is indexed based on a pin function index. The pin function register is configured to store a value of the pin function index. The processor is configured to: generate the plurality of source patterns; execute a pin-mapping operation included in an instruction to generate a set of source selection signals for the set of test channels based on the value of the pin function index and the lookup table set; and select and output a source signal from the plurality of source patterns for each test channel based on a corresponding source selection signal for the respective test channel.

In still another aspect, a method for providing a set of source signals to a set of test channels is provided. A plurality of source patterns are generated. A pin-mapping operation included in an instruction is executed to generate a set of source selection signals for the set of test channels based on a lookup table set and a value of a pin function index. The lookup table set describes a mapping relationship between the plurality of source patterns and the set of test channels. The lookup table set is indexed based on the pin function index. The value of the pin function index is retrieved from a pin function register. A source signal from the plurality of source patterns is selected and outputted for each test channel based on a corresponding source selection signal for the respective test channel.

In yet another aspect, a test equipment is provided. The test equipment includes a set of test channels and a pattern generation system. The set of test channels is configured to drive a set of pins of a DUT. The pattern generation system includes a pattern generator, a memory, a pin function register, a pin function mapper, and a set of source selectors. The pattern generator is configured to generate a plurality of source patterns. The memory is configured to store a lookup table set. The lookup table set describes a mapping relationship between the plurality of source patterns and the set of test channels, and is indexed based on a pin function index. The pin function register is configured to store a value of the pin function index. The pin function mapper is coupled to the memory and the pin function register, and is configured to execute a pin-mapping operation included in an instruction to generate a set of source selection signals based on the value of the pin function index and the lookup table set. The set of source selectors is coupled to the pattern generator, the pin function mapper, and the set of test channels. Each source selector is configured to select and output a source signal from the plurality of source patterns to a corresponding test channel based on a corresponding source selection signal received from the pin function mapper.

In yet another aspect, a test equipment is provided. The test equipment includes a set of test channels and a pattern generation system. The set of test channels is configured to drive a set of pins of a DUT. The pattern generation system includes a memory, a pin function register, and a processor. The memory is configured to store a lookup table set. The lookup table set describes a mapping relationship between a plurality of source patterns and the set of test channels, and is indexed based on a pin function index. The pin function register is configured to store a value of the pin function index. The processor is configured to: generate the plurality of source patterns; execute a pin-mapping operation included in an instruction to generate a set of source selection signals for the set of test channels based on the value of the pin function index and the lookup table set; and select and output a source signal from the plurality of source patterns for each test channel based on a corresponding source selection signal for the respective test channel.

In yet another aspect, a computer-readable storage medium configured to store program instructions which, in response to an execution by a processor, cause the processor to perform a process is provided. The process includes: generating a plurality of source patterns; executing a pin-mapping operation included in an instruction to generate a set of source selection signals for a set of test channels based on a lookup table set and a value of a pin function index, where the lookup table set describes a mapping relationship between the plurality of source patterns and the set of test channels, the lookup table set is indexed based on the pin function index, and the value of the pin function index is retrieved from a pin function register; and selecting and outputting a source signal from the plurality of source patterns for each test channel based on a corresponding source selection signal for the respective test channel.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5 illustrates a graphic representation of exemplary lookup tables, according to some aspects of the present disclosure.

Figure 1:
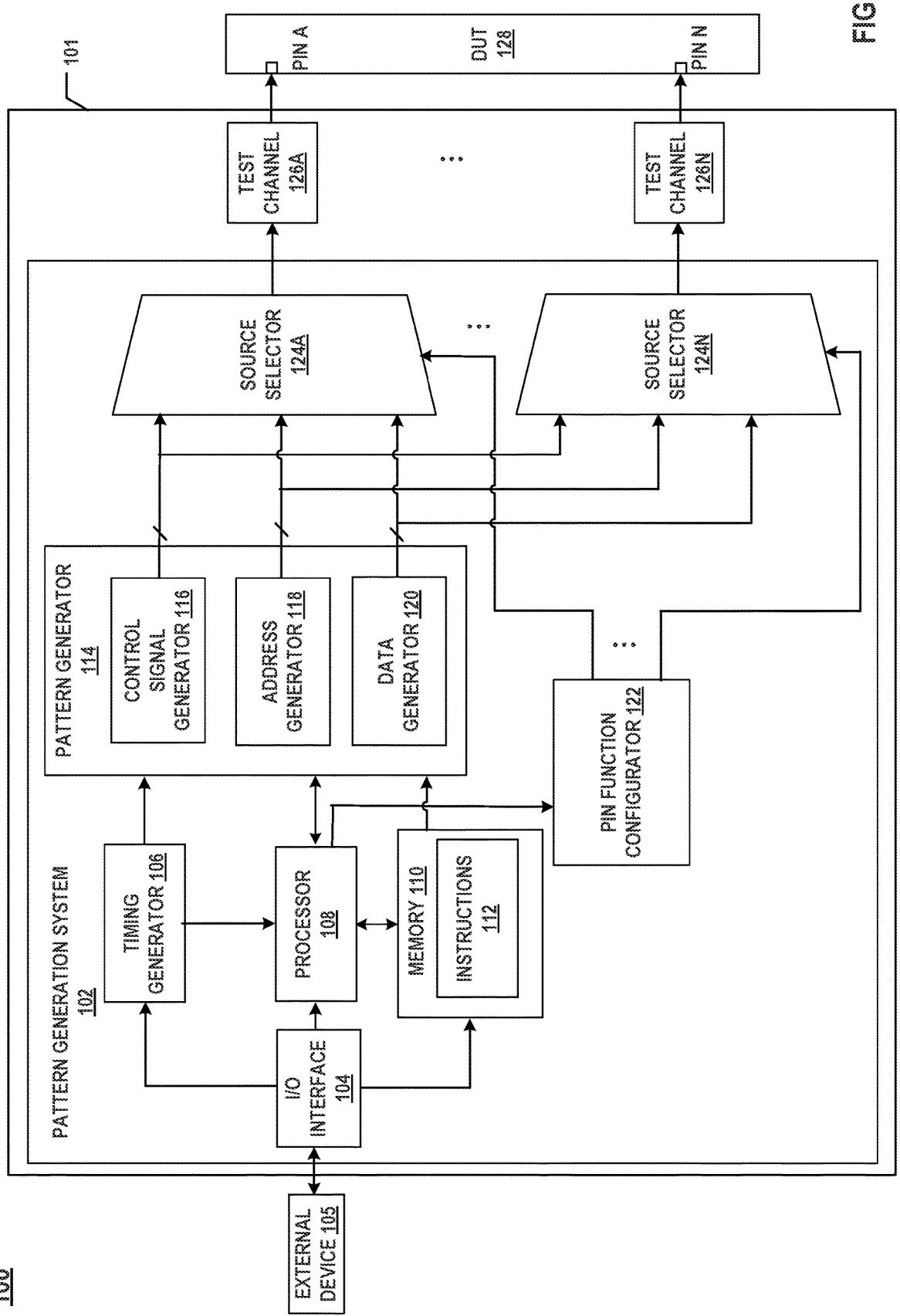
FIG. 1 illustrates a block diagram of an exemplary test environment including a test equipment and a DUT, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A DUT may include a set of pins coupled to a set of test channels of a test equipment, respectively. The test equipment can provide a set of source signals (e.g., waveforms) to drive the set of pins in the DUT through the set of test channels. The set of source signals can be generated by a pattern generation system included in the test equipment. Generally, each source signal is designed with a fixed behavior. For example, a source signal generated by an address arithmetic logic unit (Address ALU) can be an address signal used to represent an address of a memory device. A control signal generated by a controller can be used for controlling operations such as a read operation, a write operation, or any other type of operations.

However, a pin in the DUT may have multiple functions. For example, the pin may act as an address pin at a first test cycle, while at a second test cycle, the pin may act as a control signal pin. Therefore, a test channel coupled to the pin may need to perform multiple driving behaviors in order to drive the pin to achieve the multiple functions at different test cycles. As a result, the test channel coupled to the multiple-function pin needs to be provided with different source signals at different test cycles. For example, a pin DQ0 of an embedded multi-media-card (eMMC) can be driven by a data source or sampled as an R/B signal or a cyclic redundancy check (CRC) token in a command 25 (CMD25) sequence. The data source, the R/B signal, and the CRC token can be programmed as a plurality of source signals by the test equipment and multiplexed into a test channel coupled to the pin DQ0 of the DUT. Here, the pin DQ0 of the DUT may be a virtual pin and used to represent any pin of the DUT.

In this disclosure, multiplexing of a plurality of source signals to a test channel that is coupled to a particular pin of the DUT can represent a mapping from the plurality of source signals to the test channel (or a mapping from the plurality of source signals to the pin), and can be referred to as a pin function mapping for the particular pin of the DUT.

The test equipment may use different approaches to multiplex the plurality of source signals into the test channel that is coupled to the pin of the DUT. In a first example approach, a user can write program instructions or codes that explicitly map a particular source signal to the test channel at each test cycle. For example, the user can write an instruction that explicitly assigns a source signal to a pin for a particular test cycle. However, in this approach, the pin function mapping for all the pins needs to be coded in every single instruction, which is inefficient and also limits the reusability of the program. For example, if the pin function mapping for one or more pins needs to be changed, the user may need to change all the instructions that are used to configure the one or more pins. The first example approach is described below in more detail with reference to FIGS. 2A-2B.

In a second example approach, a lookup table can be created for each test channel so that a set of lookup tables is created for a set of test channels. Each lookup table describes a mapping relationship between the plurality of source signals and a respective test channel, and can be indexed using a parameter such as a pin function index. The test equipment can search a corresponding lookup table based on a value of the pin function index and select a source signal from the plurality of source signals for each test channel. For example, the test equipment searches the lookup table of the test channel and retrieves an identity of a source signal that maps to the value of pin function index from the lookup table. Then, the test equipment supplies the source signal to the test channel to drive a corresponding pin of the DUT. In this case, the source signal supplied to the test channel can be changed by modifying the value of the pin function index, and so, a function of the pin can be switched in response to a change of the source signal. However, in this approach, although a default value may be set for the pin function index and used to identify source signals in a certain test cycle, a value for the pin function index may need to be set in every instruction if the value is not equal to the default value, which is inefficient and limits the portability of the program. The second example approach is described below in more detail with reference to FIGS. 3A-3C.

To address the aforementioned issues, the present disclosure introduces a solution in which: a pin-mapping operation can be executed to determine a current value (e.g., an updated value) of the pin function index at a test cycle; the current value of the pin function index can also be stored in a register for later use at future test cycles; and a source signal from a plurality of source patterns can be mapped to a corresponding test channel based on the current value of the pin function index. In this solution, there is no need to explicitly map a particular source signal to the test channel at each test cycle or explicitly specify a value for the pin function index at each test cycle in program coding. This solution can provide more flexibility for program development on testing DUTs. For example, a mapping of source signals to pins can be implemented in a higher level of program routines, so that a configuration of this mapping can be separated from specific test sub-routines for the pins. Thus, the test sub-routines can focus on waveform generation for testing the pins, and can be easily reused for other situations. As a result, program development efficiency and program reusability for the testing equipment can be improved.

FIG. 1 illustrates a block diagram of an exemplary test environment 100 including a test equipment 101 and a DUT 128, according to some aspects of the present disclosure. In some implementations, test environment 100 may include an external device 105. External device 105 can be a server, a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. External device 105 can include a processor, a memory, and any other appropriate components for providing the functionality described herein.

DUT 128 can be a memory device (e.g., a three-dimensional NAND Flash memory device), an integrated circuit or any other type of electronic devices under test. DUT 128 may include a set of pins including, for example, a pin A and a pin N shown in FIG. 1.

Test equipment 101 can be an automatic test equipment (ATE), or any other integrated circuit tester that is capable of performing a test for DUT 128. By way of examples, FIG. 1 shows that test equipment 101 is coupled to one DUT 128. In practice, test equipment 101 may be coupled to a plurality of DUTs 128 and perform tests for the plurality of DUTs 128 simultaneously.

In some implementations, test equipment 101 may include a pattern generation system 102 and a set of test channels 126A, . . . , 126N (also referred to as test channel 126 collectively or individually). Each test channel 126 is coupled to a pin of DUT 128, and drives the pin to carry out a test activity on the pin. For example, test channel 126A is coupled to pin A of DUT 128, and test channel 126N is coupled to pin N of DUT 128. In some implementations, each test channel 126 may be coupled to multiple pins from multiple DUTs 128 simultaneously. For example, test channel 126A can be coupled to pin A of a first DUT 128 and pin A of a second DUT 128, and test channel 126N can be coupled to pin N of first DUT 128 and pin N of second DUT 128.

In some implementations, pattern generation system 102 may include an input/output (I/O) interface 104, a timing generator 106, a processor 108, a memory 110, a pattern generator 114, a pin function configurator 122, and a set of source selectors 124A, . . . , 124N (also referred to as source selector 124 collectively or individually).

I/O interface 104 may be an interface that couples pattern generation system 102 to external device 105. For example, I/O interface 104 may include one or more of a network interface, a universal serial bus (USB), a thunderbolt, or any other suitable type of interfaces that are capable of outputting or receiving data to or from external device 105. In some implementations, I/O interface 104 can receive data from external device 105 and send the data to one or more components of pattern generation system 102. For example, I/O interface 104 receives instructions or codes from external device 105, and stores the instructions or codes in memory 110.

Timing generator 106 can be configured to generate clock signals and provide the clock signals to other components of pattern generation system 102 and the set of test channels 126. For example, timing generator 106 includes a clock generator for generating the clock signals.

Processor 108 can be any suitable type of processors, for example, a central processing unit (CPU), a microprocessor, a system-on-chip (SoC), or an application processor (AP), etc. Processor 108 may include various computing architectures including a complex instruction set computer (CISC) architecture, a reduced instruction set computer (RISC) architecture, or an architecture implementing a combination of instruction sets. Although only a single processor is shown in FIG. 1, multiple processors may be included. Processor 108 can be configured to send or receive data to or from memory 110. For example, processor 108 can be configured to receive instructions from memory 110 and execute the instructions to provide the functionality described herein.

Memory 110 stores data (e.g., instructions 112) that may include code or routines for performing part of or all of the techniques described herein. Memory 110 may be a dynamic random access memory (DRAM) device, a static random access memory (SRAM) device, a hard disk drive, a floppy disk drive, a CD-ROM device, a DVD-ROM device, a DVD-RAM device, a DVD-RW device, a flash memory device (e.g., NAND Flash memory device), or some other suitable memory device.

Pattern generator 114 may be coupled to I/O interface 104, timing generator 106, processor 108, memory 110, pin function configurator 122, and the set of source selectors 124, respectively. Pattern generator 114 can be configured to generate a plurality of source patterns based on instructions 112 stored in memory 110. The plurality of source patterns can act as source signals to drive a set of pins in DUT 128. In some implementations, pattern generator 114 includes a programmable logic device (PLD) (e.g., a field-programmable logic array (FPGA)) that is configured to provide the functionality described herein. In some implementations, in response to the execution of instructions 112 or other data stored in memory 110, processor 108 can be configured to implement the functionality of pattern generator 114.

In some implementations, pattern generator 114 can include a control signal generator 116, an address generator 118, and a data generator 120. The plurality of source patterns generated by pattern generator 114 can include one or more of a control signal (CS) pattern generated by control signal generator 116, an address pattern generated by address generator 118, and a data pattern generated by data generator 120. The plurality of source patterns can be supplied to each source selector 124.

In some implementations, control signal generator 116 may include a controller configured to generate the control signal pattern. Control signal generator 116 can retrieve an instruction from memory 110, generate the control signal pattern based on the instruction, and output the control signal pattern to each source selector 124. The control signal pattern may include a set of control signals. For example, the control signal pattern may include data describing a set of commands for performing different operations.

In some implementations, address generator 118 may include an address ALU configured to generate the address pattern. Address generator 118 can retrieve an instruction from memory 110, generate the address pattern based on the instruction, and output the address pattern to each source selector 124. The address pattern may include data describing an address of a memory device. For example, the address pattern includes address data of a NAND Flash memory device embedded in DUT 128.

In some implementations, data generator 120 can retrieve an instruction from memory 110, generate the data pattern based on the instruction, and output the data pattern to each source selector 124. The data pattern may include, for example, data to be executed on by an operation, data to be written to an address of a memory device embedded in DUT 128, or any other suitable data for performing a test for DUT 128.

Pin function configurator 122 may be coupled to I/O interface 104, timing generator 106, processor 108, memory 110, pattern generator 114, and the set of source selectors 124, respectively. In some implementations, pin function configurator 122 can be implemented using a PLD (e.g., an FPGA) that is configured to provide the functionality described herein. In some implementations, in response to the execution of instructions 112 or other data stored in memory 110, processor 108 can be configured to implement the functionality of pin function configurator 122.

Pin function configurator 122 can be configured to perform a pin function mapping for the set of test channels 126 (or equivalently, for a set of pins that is respectively coupled to the set of test channels 126). For example, pin function configurator 122 can retrieve instructions 112 from memory 110, and generate a set of source selection signals for the set of test channels 126 based on instructions 112. Pin function configurator 122 can provide the set of source selection signals to the set of source selectors 124 that is coupled to the set of test channels 126, respectively. Then, each source selector 124 multiplexes the plurality of source patterns to a test channel 126 based on a source selection signal provided to the respective source selector 124. As a result, a mapping from the plurality of source patterns to test channel 126 (as well as a pin function mapping for a pin coupled to test channel 126) can be achieved. Pin function configurator 122 is described below in more detail with reference to FIGS. 2A-6.

The set of source selectors 124 may be coupled to I/O interface 104, timing generator 106, processor 108, memory 110, pattern generator 114, pin function configurator 122, and the set of test channels 126, respectively. In some implementations, each source selector 124 includes a multiplexer (MUX) that is configured to provide the functionality described herein. In some implementations, in response to the execution of instructions 112 or other data stored in memory 110, processor 108 can be configured to implement the functionality of source selector 124.

In some implementations, each source selector 124 may receive a plurality of source patterns from pattern generator 114. Each source selector 124 may also receive a corresponding source selection signal from pin function configurator 122, and multiplex the plurality of source patterns to test channel 126 based on the corresponding source selection signal. Source selector 124 is described below in more detail with reference to FIGS. 2A-4C.

In some implementations, each test channel 126 may be configured to perform one or more operations including, for example, forming a waveform based on a source signal received from source selector 124, performing signal leveling on the waveform (or the source signal), and performing a sampling function on an output from a pin of DUT 128 that is coupled to test channel 126, etc. Test channel 126 may generate an output based on the source signal, and drive the pin coupled to test channel 126 based on the output. When test channel 126 works in a sampling mode (e.g., performing a sampling function), the source signal received from source selector 124 can be used as expected data to be sampled at a certain test cycle.

Figure 2A:
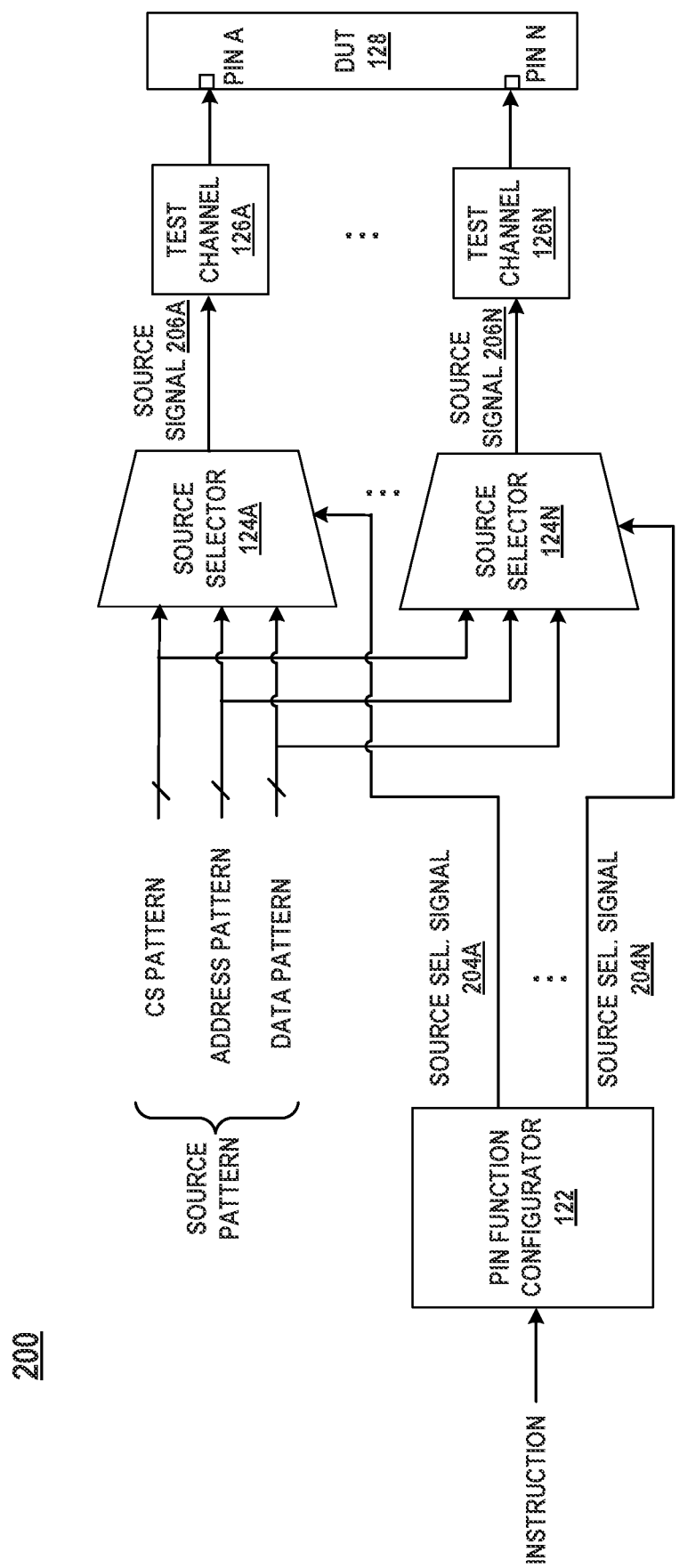
FIG. 2A illustrates a schematic diagram of a pin function configurator for performing a pin function mapping process, according to some aspects of the present disclosure.

FIG. 2A illustrates a schematic diagram 200 of pin function configurator 122 for performing a pin function mapping process, according to some aspects of the present disclosure. In some examples, for each test channel 126 at each test cycle, a user may provide an instruction to explicitly map a particular source signal to test channel 126 (or to explicitly map a particular source signal to a pin coupled to test channel 126). The source signal can be a signal from the plurality of source patterns.

For example, the user can write a first instruction for a test cycle n to assign a control signal A and a control signal B to pin A and pin N of DUT 128, respectively, a second instruction for a test cycle n+1 to assign the control signal A and a control signal C to pin A and pin N respectively, and a third instruction for a test cycle n+2 to assign a data bit[x] and a data bit[x+1] to pin A and pin N respectively. Here, control signals A, B, and C are controls signals from the control signal pattern. The data bit[x] and the data bit[x+1] are data from the data pattern. By way of examples, the first, second, and third instructions can be expressed as follows respectively:

CYCLE n: DUT pin "A"←control signal A; DUT pin "N"←control signal B;
CYCLE n+1: DUT pin "A"←control signal A; DUT pin "N"←control signal C;
CYCLE n+2: DUT pin "A"←data bit[n]; DUT pin "N"←data bit[x+1].

In this case, at the test cycle n, pin function configurator 122 can generate a source selection signal 204A for source selector 124A based on the first instruction. Source selection signal 204A may indicate a selection of the control signal A for test channel 126A at the test cycle n. Then, in response to receiving source selection signal 204A from pin function configurator 122, source selector 124A selects a source signal 206A (e.g., the control signal A) from the plurality of source patterns based on source selection signal 204A. Source selector 124A outputs the source signal 206A (e.g., the control signal A) to test channel 126A to drive pin A at the test cycle n. Similarly, at the test cycle n, pin function configurator 122 can generate a source selection signal 204N for source selector 124N based on the first instruction. Source selection signal 204N may indicate a selection of the control signal B for test channel 126N at the test cycle n. Then, in response to receiving source selection signal 204N from pin function configurator 122, source selector 124N selects a source signal 206N (e.g., the control signal B) from the plurality of source patterns based on source selection signal 204A. Source selector 124N outputs the source signal 206N (e.g., the control signal N) to test channel 126N to drive pin N at the test cycle n. Similar operations can be performed for the second and third instructions, which will not be repeated here. Here, source selection signals 204A, ..., 204N may be referred to as source selection signal 204 collectively or individually.

Figure 2B:
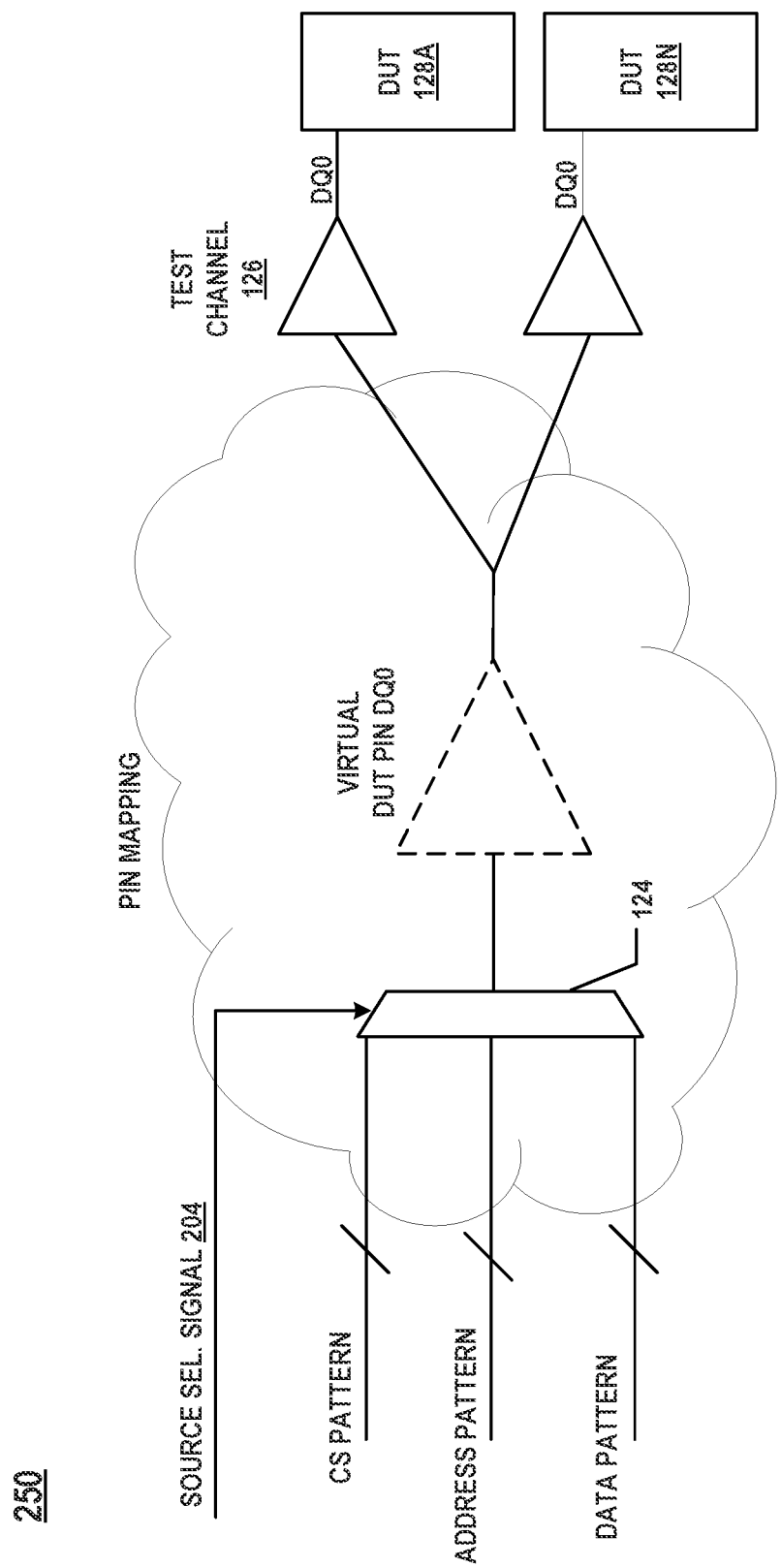
FIG. 2B illustrates a graphic representation for providing a source signal to a test channel with reference to the pin function mapping process in FIG. 2A, according to some aspects of the present disclosure.

FIG. 2B illustrates a graphic representation 250 for providing a source signal to test channel 126 with reference to the pin function mapping process in FIG. 2A, according to some aspects of the present disclosure. Test channel 126 may be coupled to a pin DQ0 of DUT 128. Pin DQ0 may represent any pin of DUT 128. For example, test channel 126 may be coupled to pin DQ0 of DUT 128A and pin DQ0 of DUT 128N. At each test cycle, pin function configurator 122 can generate source selection signal 204 for test channel 126 based on an instruction that explicitly maps a particular source signal to test channel 126. Source selector 124 coupled to test channel 126 may receive source selection signal 204 from pin function configurator 122, select a source signal from the plurality of source patterns based on source selection signal 204, and provide the selected source signal to test channel 126. Then, test channel 126 may drive pin DQ0 of DUT 128A and pin DQ0 of DUT 128N based on the selected source signal.

In the approach described with reference to FIGS. 2A-2B, a pin function mapping of all pins may be coded in every instruction, which may limit the readability and reusability of a test program. For example, for a test program that is initially designed for a first test equipment, when the test program is ported to a second test equipment with different resources, changes on the pin function mapping may need to be applied to all program instructions line by line. This line-by-line modification on the program instructions is inefficient, and may limit the development efficiency and code maintainability of the test program.

Figure 3A:
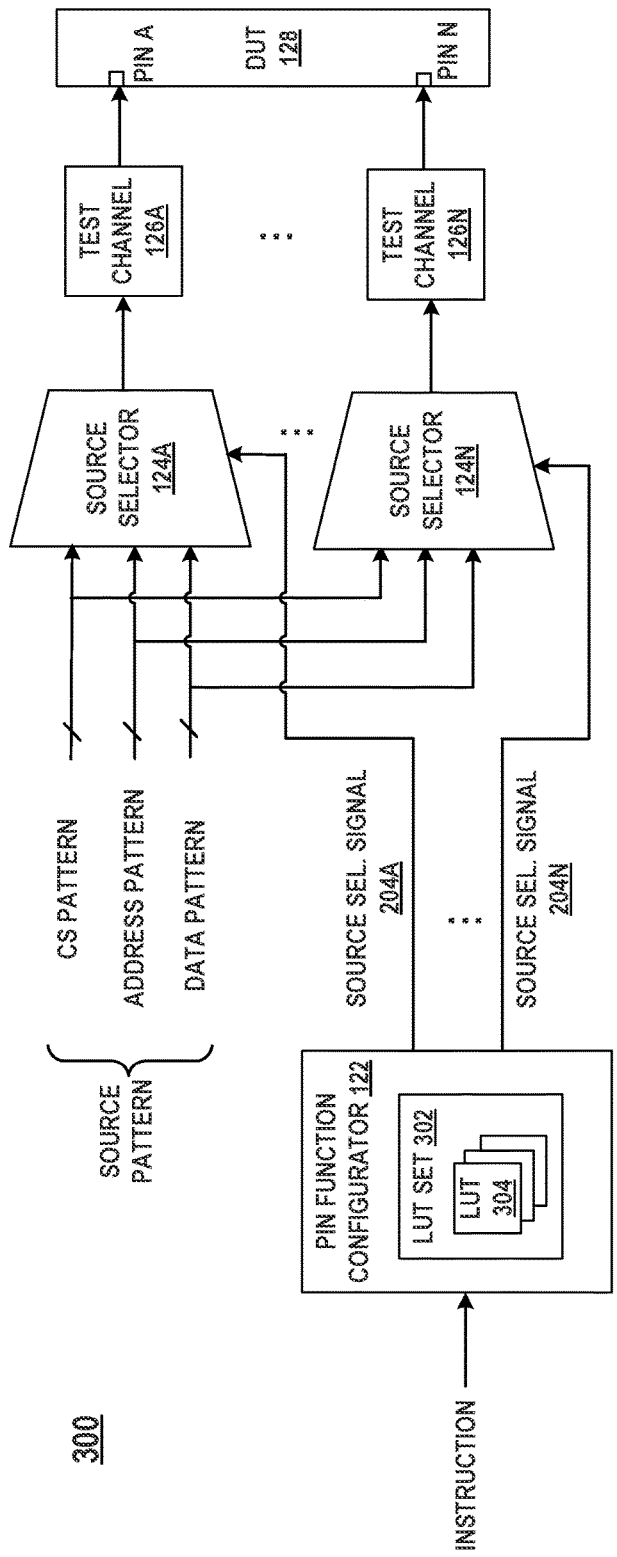
FIG. 3A illustrates another schematic diagram of the pin function configurator for performing the pin function mapping process, according to some aspects of the present disclosure.
Figure 3B:
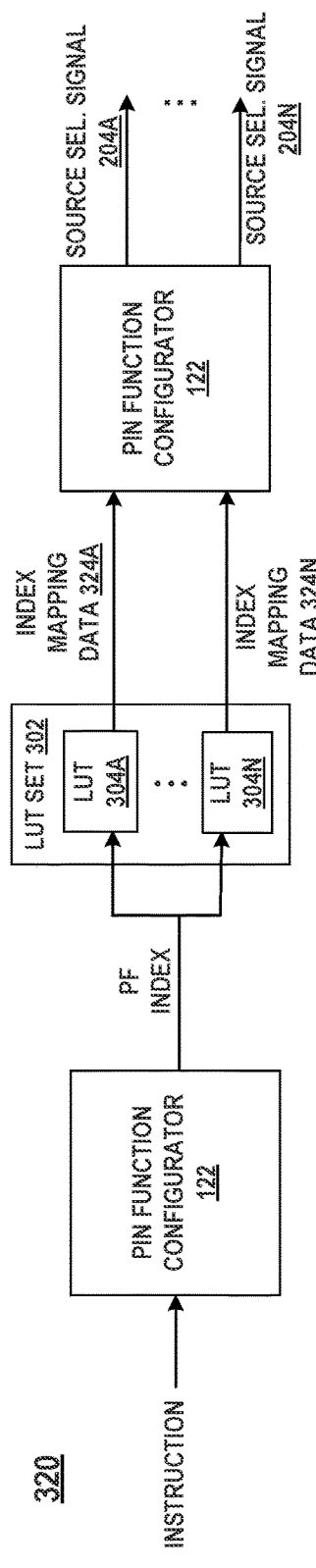
FIG. 3B illustrates a flow of exemplary operations in the pin function mapping process with reference to FIG. 3A, according to some aspects of the present disclosure.

FIG. 3A illustrates another schematic diagram 300 of pin function configurator 122 for performing a pin function mapping process, and FIG. 3B illustrates a flow 320 of exemplary operations in the pin function mapping process of FIG. 3A, according to some aspects of the present disclosure. In FIGS. 3A-3B, pin function configurator 122 may include a lookup table (LUT) set 302. Lookup table set 302 can predefine and store a mapping relationship between the plurality of source patterns and the set of test channels 126. For example, lookup table set 302 can be indexed using a parameter such as a pin function (PF) index. Lookup table set 302 can use different values of the pin function index to list out different combinations of source signals for the set of test channels 126 at a test cycle. Each value of the pin function index can be used to identify a set of source signals from the plurality of source patterns for the set of test channels 126, where the set of source signals may indicate a set of driving behaviors for the set of test channels 126, respectively.

In some implementations, lookup table set 302 can include a set of lookup tables 304A, ..., 304N (also referred to as lookup table 304 collectively or individually). Each lookup table 304 corresponds to one test channel 126 from the set of test channels 126. Each lookup table 304 can be indexed based on the pin function index, and store data describing a mapping relationship between the plurality of source patterns and respective test channel 126 corresponding to lookup table 304. Examples of lookup tables 304 are described below with reference to FIG. 5.

With reference to FIGS. 3A-3B, for the set of test channels 126 at a test cycle, a user may provide an instruction that includes a value for the pin function index. Pin function configurator 122 can search lookup table set 302 using the value of the pin function index, and determine a set of source signals for the set of test channels 126 at the test cycle based on lookup table set 302. Alternatively, if lookup table set 302 is organized into a set of lookup tables 304, pin function configurator 122 can search each lookup table 304 using the value of the pin function index. Pin function configurator 122 can determine a source signal for each test channel 126 at the test cycle based on respective lookup table 304 corresponding to test channel 126.

Specifically, pin function configurator 122 can search lookup table set 302 (or lookup tables 304) using the value of the pin function index. Pin function configurator 122 can obtain a set of index mapping data 324A, ..., 324N from lookup table set 302 (or lookup tables 304) based on the value of the pin function index. Index mapping data 324A, ..., 324N can be referred to as, collectively or individually, index mapping data 324. The set of index mapping data 324 may identify a set of source signals selected for the set of test channels 126 at the test cycle, with each index mapping data 324 indicating a source signal for a corresponding test channel 126. Pin function configurator 122 can generate a set of source selection signals 204 for the set of source selectors 124 based on the set of index mapping data 324. The set of source selectors 124 can select a set of source signals from the plurality of source patterns for the set of test channels 126 based on the set of source selection signals 204.

For example, assume that lookup table set 302 defines that: (1) if the pin function index has a value p0, a control signal A is selected for test channel 126A and a control signal B is selected for test channel 126N; and (2) if the pin function index has a value p1, a control signal C is selected for test channel 126A and a data bit[x] is selected for test channel 126N. Control signals A, B, and C are controls signals from the control signal pattern, and the data bit[x] is a data signal from the data pattern. The user can write a first instruction that sets the pin function index to be p0 at a test cycle n. The user can also write a second instruction that sets the pin function index to be p1 at a test cycle n+1. The first and second instructions can be respectively expressed as follows, with a symbol PF_INDEX representing the pin function index:

CYCLE n: PF_INDEX←p0;
//DUT pin A←control signal A; DUT pin N←control signal B
CYCLE n+1: PF_INDEX←p1.
//DUT pin A←control signal C; DUT pin N←data bit[x].

At the test cycle n, pin function configurator 122 can determine the value of the pin function index to be p0 based on the first instruction, and search lookup table 304A and lookup table 304N using the value p0 of the pin function index. Pin function configurator 122 can obtain index mapping data 324A from lookup table 304A and index mapping data 324N from lookup table 304N based on the value p0 of the pin function index. Index mapping data 324A indicates that the control signal A is selected for test channel 126A, and index mapping data 324N indicates that the control signal B is selected for test channel 126N.

Next, pin function configurator 122 can generate source selection signal 204A (e.g., the control signal A) for source selector 124A based on index mapping data 324A, so that source selector 124A selects the control signal A for test channel 126A at the test cycle n. Similarly, pin function configurator 122 can generate source selection signal 204N (e.g., the control signal B) for source selector 124N based on index mapping data 324N, so that source selector 124N selects the control signal B for test channel 126N at the test cycle n. Similar operations can be performed for the second instruction at the test cycle n+1, which will not be repeated here.

Figure 3C:
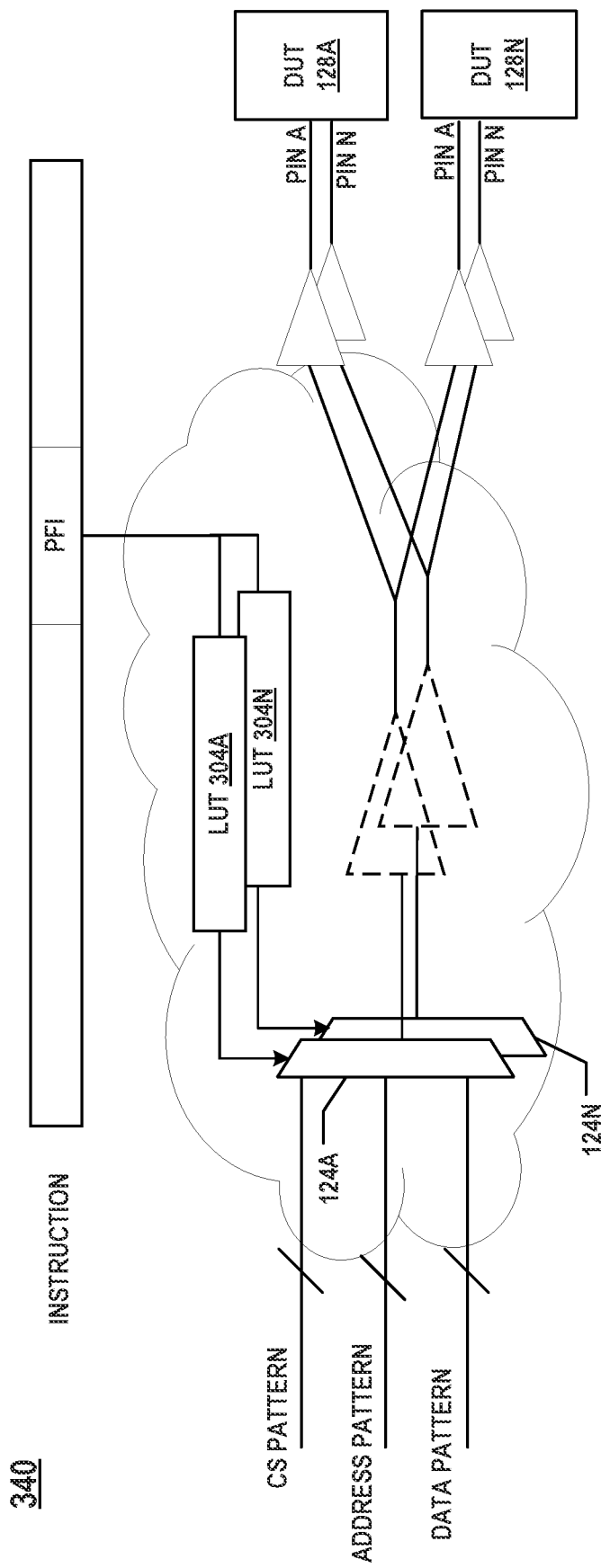
FIG. 3C illustrates a graphic representation for providing source signals to test channels with reference to the pin function mapping process in FIGS. 3A-3B, according to some aspects of the present disclosure.

FIG. 3C illustrates a graphic representation 340 for providing source signals to test channels 126 with reference to the pin function mapping process in FIGS. 3A-3B, according to some aspects of the present disclosure. Test channel 126A and test channel 126N may be coupled to pin A and pin N of DUT 128, respectively. In FIG. 3C, test channel 126A may be coupled to pin A of DUT 128A and pin A of DUT 128N, and test channel 126N may be coupled to pin N of DUT 128A and pin N of DUT 128N.

At a test cycle, pin function configurator 122 can obtain a value (e.g., PFI) for the pin function index from an instruction. Pin function configurator 122 can search lookup table 304A and lookup table 304N using the value of the pin function index, and obtain index mapping data 324A from lookup table 304A and index mapping data 324N from lookup table 304N. Pin function configurator 122 can generate source selection signal 204A for test channel 126A based on index mapping data 324A, and generate source selection signal 204N for test channel 126N based on index mapping data 324N. Source selector 124A may select a first source signal from the plurality of source patterns based on source selection signal 204A, and provide the first source signal to test channel 126A. Then, test channel 126A may drive pin A of DUT 128A and pin A of DUT 128N based on the first source signal. Similarly, source selector 124N may select a second source signal from the plurality of source patterns based on source selection signal 204N, and provide the second source signal to test channel 126N. Then, test channel 126N may drive pin N of DUT 128A and pin N of DUT 128N based on the second source signal.

With reference to FIGS. 3A-3C, a pin function mapping can be achieved by changing a value of the pin function index so that a set of source signals provided to the set of test channels 126 can be changed, which is different from the approach of FIGS. 2A-2B that needs to change related instructions line by line. However, in FIGS. 3A-3C, the value of the pin function index needs to be specified in every instruction, which is also inefficient and may limit the reusability and portability of a test program.

Figure 4A:
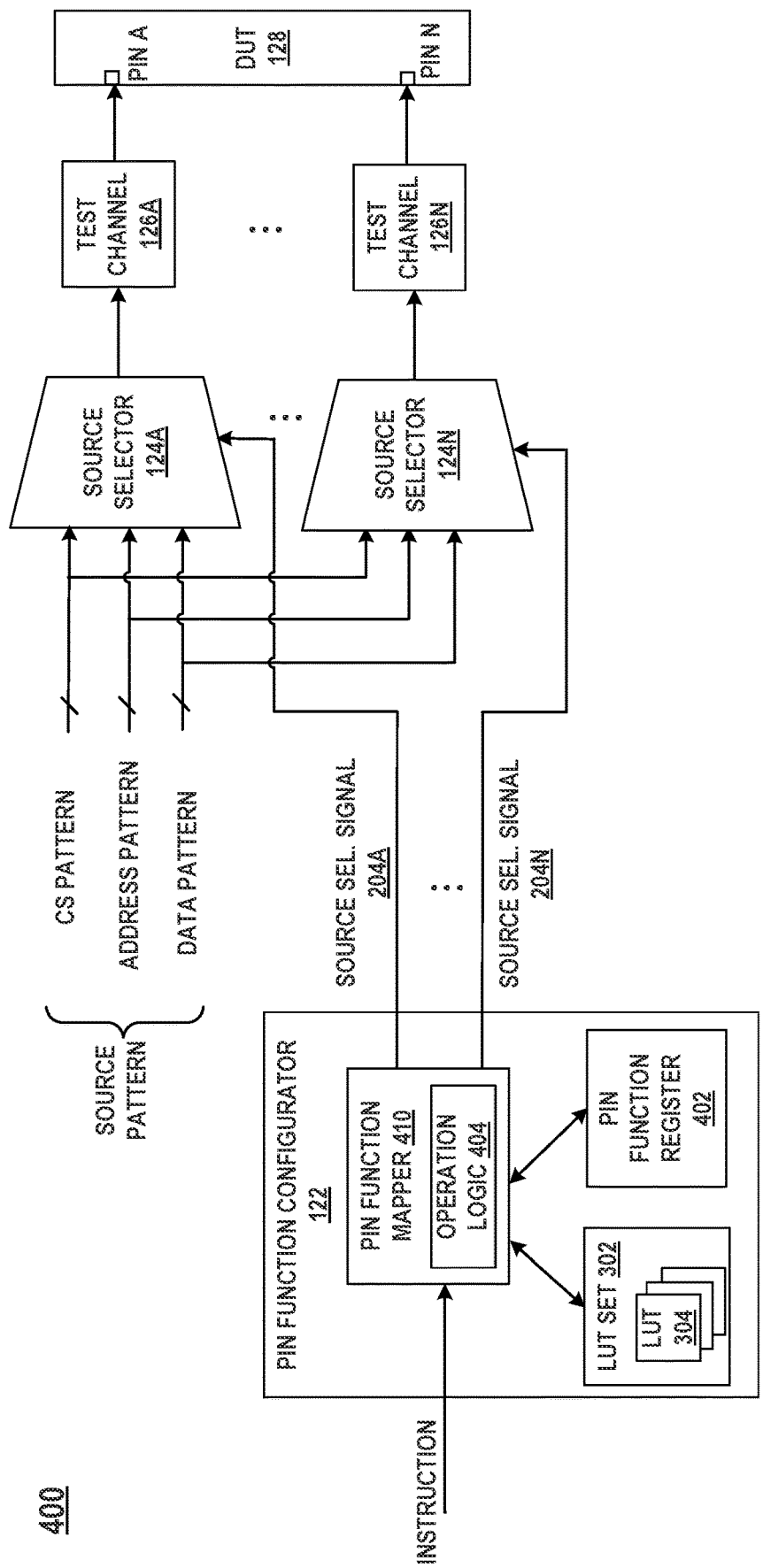
FIG. 4A illustrates still another schematic diagram of the pin function configurator for performing the pin function mapping process, according to some aspects of the present disclosure.
Figure 4B:
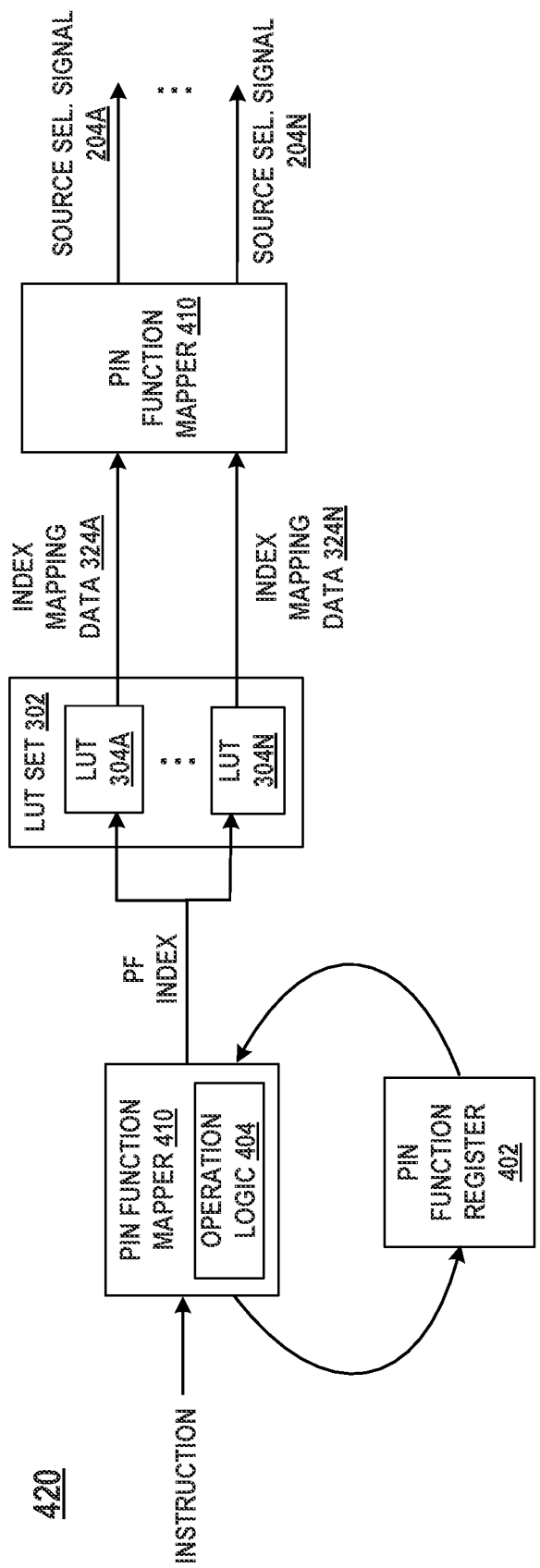
FIG. 4B illustrates a flow of exemplary operations in the pin function mapping process with reference to FIG. 4A, according to some aspects of the present disclosure.

FIG. 4A illustrates still another schematic diagram 400 of pin function configurator 122 for performing a pin function mapping process, and FIG. 4B illustrates a flow 420 of exemplary operations in the pin function mapping process of FIG. 4A, according to some aspects of the present disclosure. With reference to FIGS. 4A-4B, pin function configurator 122 may include a memory that stores lookup table set 302, a pin function register 402, and a pin function mapper 410. In some implementations, lookup table set 302 can be stored in memory 110. Pin function register 402 can be configured to store a latest value of the pin function index obtained from a previous test cycle. Pin function register 402 can also be updated using an updated value of the pin function index at a current test cycle.

Compared with FIGS. 2A-2B and 3A-3C, a structure of an instruction in FIGS. 4A-4B can be modified to include a pin-mapping operation. A pin-mapping operation can describe an approach to generate or update a value of the pin function index. For example, the pin-mapping operation can include a load operation, an addition operation, a subtraction operation, an increment operation, a noop operation, or any other suitable operation. In some implementations, the instruction can also include operation data. Bit fields of the instruction that are used to carry the operation data can also be reused for carrying other data when the operation data is omitted in the instruction.

In some implementations, the operation data can be any data that the pin-mapping operation can be operated on to generate or update a value of the pin function index. For example, the operation data can be used to change the value of the pin function index to any other feasible value within a value range of the pin function register using a load operation or an addition operation. Specifically, the operation data can be used to specify a value of the pin function index if the pin-mapping operation is a load operation. Alternatively, the operation data can be used to change the value of the pin function index to any other feasible value by adding a current value of the pin function index with the operation data.

Pin function mapper 410 can be coupled to lookup table set 302, pin function register 402, and the set of source selectors 124. In some implementations, pin function mapper 410 can be implemented using a PLD. In some implementations, the PLD can include an FPGA. Pin function mapper 410 can be configured to execute a pin-mapping operation included in an instruction to generate a set of source selection signals 204 based on one or more of lookup table set 302 and the latest value of the pin function index stored in pin function register 402, as described below in more detail.

In some implementations, pin function mapper 410 can execute the pin-mapping operation to generate an updated value of the pin function index. Specifically, pin function mapper 410 can retrieve the latest value of the pin function index stored in pin function register 402. Pin function mapper 410 can execute the pin-mapping operation to generate the updated value of the pin function index based on one or more of the operation data and the latest value of the pin function index. Pin function mapper 410 can also be configured to store the updated value of the pin function index in pin function register 402.

For example, when the pin-mapping operation is a load operation, pin function mapper 410 can generate the updated value of the pin function index as the operation data included in the instruction. When the pin-mapping operation is an addition operation, pin function mapper 410 can generate the updated value of the pin function index as a sum of the operation data and the latest value of the pin function index stored in pin function register 402. When the pin-mapping operation is an increment operation, pin function mapper 410 can generate the updated value of the pin function index as the latest value of the pin function index with an increment of 1. When the pin-mapping operation is a noop operation, pin function mapper 410 can choose the latest value of the pin function index stored in pin function register 402 to be the updated value of the pin function index. The above operations of pin function mapper 410 can be expressed as follows by way of examples:

updated_PFI = PF_OPD when PF_OP = "Load" else

= stored_PFI + PF_OPD when PF_OP = "Addition" else

= stored_PFI + 1 when PF_OP = "Increment" else

= stored_PFI when PF_OP = "Noop" else.

Here, updated_PFI represents the updated value of the pin function index for a current test cycle, stored_PFI represents the latest value of the pin function index that is stored in pin function register 402 and obtained from a previous test cycle, PF_OPD represents the operation data, and PF_OP represents the pin-mapping operation. As a result, the updated value of the pin function index at the current test cycle can be a result from the execution of the pin-mapping operation. For example, the updated value of the pin function index can be the latest value of the pin function index stored in pin function register 402, the operation data included in the instruction, or an output from an addition operation.

In some implementations, pin function mapper 410 can include operation logic 404 that is configured to execute the pin-mapping operation. For example, operation logic 404 can include an adder.

Next, pin function mapper 410 can obtain a set of index mapping data 324 from lookup table set 302 based on the updated value of the pin function index, and generate a set of source selection signals 204 for the set of test channels 126 based on the set of index mapping data 324. For example, pin function mapper 410 can search lookup tables 304A and 304N to obtain index mapping data 324A and 324N from lookup tables 304A and 304N based on the updated value of the pin function index, respectively. Assume that index mapping data 324A may indicate that a control signal A is selected for test channel 126A, and index mapping data 324N may indicate that an address signal X is selected for test channel 126N. Pin function mapper 410 can generate source selection signal 204A for source selector 124A based on index mapping data 324A, so that source selector 124A selects the control signal A for test channel 126A. Similarly, pin function mapper 410 can generate source selection signal 204N for source selector 124N based on index mapping data 324N, so that source selector 124N selects the address signal X for test channel 126N.

Figure 4C:
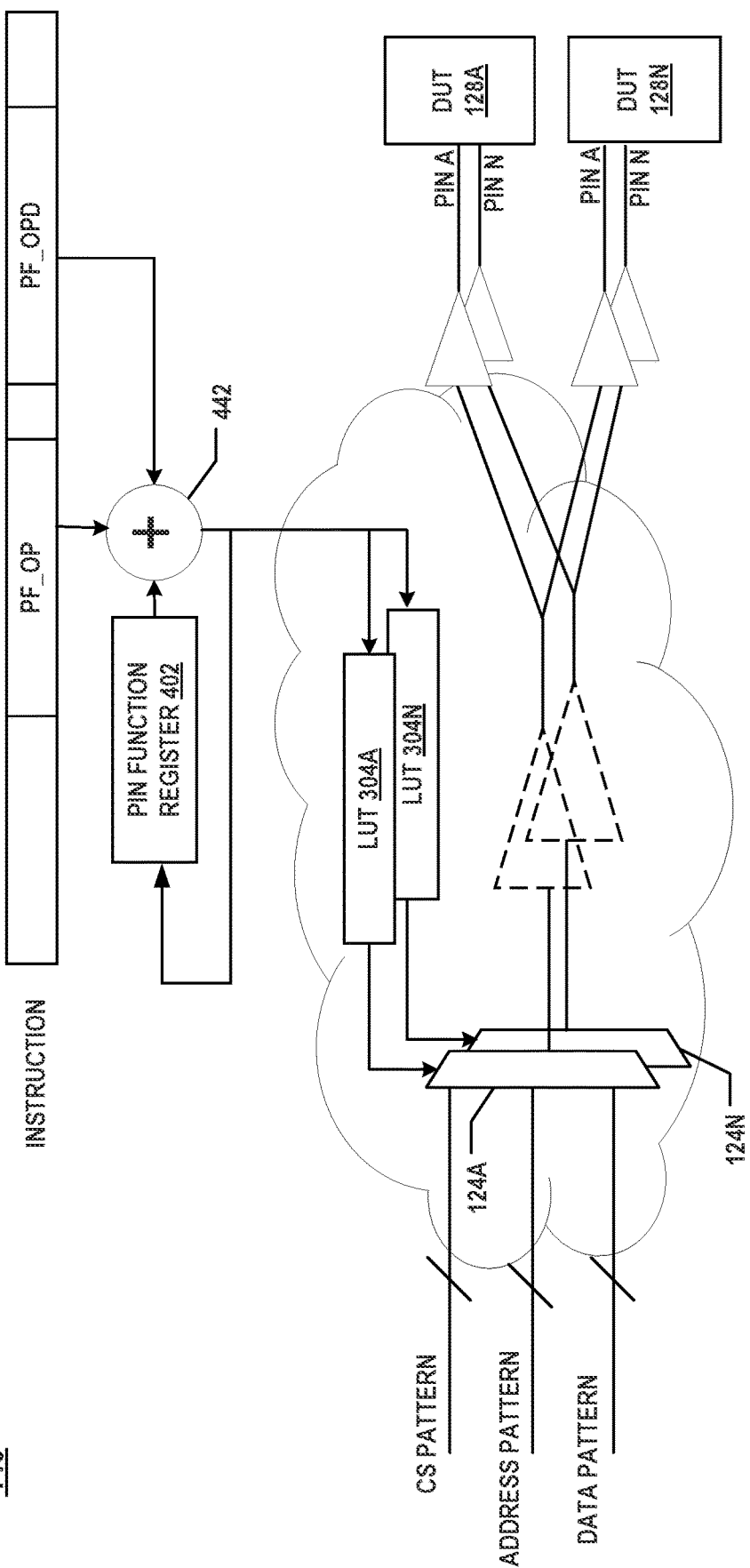
FIG. 4C illustrates a graphic representation for providing source signals to test channels with reference to the pin function mapping process in FIGS. 4A-4B, according to some aspects of the present disclosure.

FIG. 4C illustrates a graphic representation 440 for providing source signals to test channels 126 with reference to the pin function mapping process in FIGS. 4A-4B, according to some aspects of the present disclosure. An instruction can include one or more of a pin-mapping operation PF_OP and operation data PF_OPD. Pin function mapper 410 may include an adder 442 configured to perform the pin-mapping operation.

At a test cycle, pin function mapper 410 can execute the pin-mapping operation PF_OP to generate an updated value for the pin function index based on one or more of: (1) lookup tables 304; (2) a latest value of the pin function index stored in pin function register 402; and (3) the operation data PF_OPD. Next, pin function mapper 410 can search lookup table 304A and lookup table 304N using the updated value of the pin function index, and obtain index mapping data 324A from lookup table 304A and index mapping data 324N from lookup table 304N. Pin function mapper 410 can generate source selection signal 204A for test channel 126A based on index mapping data 324A, and generate source selection signal 204N for test channel 126N based on index mapping data 324N. Source selector 124A may select a first source signal from the plurality of source patterns based on source selection signal 204A, and provide the first source signal to test channel 126A. Then, test channel 126A may drive pin A of DUT 128A and pin A of DUT 128N based on the first source signal. Similarly, source selector 124N may select a second source signal from the plurality of source patterns based on source selection signal 204N, and provide the second source signal to test channel 126N. Then, test channel 126N may drive pin N of DUT 128A and pin N of DUT 128N based on the second source signal.

With reference to FIGS. 4A-4C, an instruction in FIGS. 4A-4C can define a field for the pin-mapping operation and a field for the operation data. The pin-mapping operation and the operation data can be used to determine a way to refresh pin function register 402 at a current test cycle or a coming test cycle. The instruction can share the field for the operation data with other control functions.

With reference to FIGS. 4A-4C, an example program for pin DQ0 of an eMMC can be expressed as follows:
Load PFI (0)→Call sub-routine A;
  CMD & RESP handshake, DQ all "z";
Increase PFI (1)→Call sub-routine B, generate DATA;
Increase PFI (2)→Call sub-routine C;
  strobe for CRC token;
Increase PFI (3)→Call sub-routine D, polling for Ready.

Here, PFI represents the pin function index, "Load PFI (0)" represents a load operation that updates a value of the pin function index to be the operation data at a test cycle 0, and "Increase PFI (x)" represents an increment operation that increases the value of the pin function index by 1 at a test cycle x, with x=1, 2, or 3. In the example program, the pin function mapping (e.g., the configuration of the value of the pin function index) can be separated from specific test sub-routines of the pins. When the example program is changed to be compatible with another test equipment with different resources, the specific test sub-routines of the pins can remain the same, and only the configuration of the pin function mapping needs to be changed. As a result, coding efficiency and reusability of the test program can be improved.

As described above with reference to FIGS. 3A-3C, a value of the pin function index needs to be specified in each instruction. However, by applying an approach described above with reference to FIGS. 4A-4C, various ways can be used to determine the value of the pin function index based on the pin-mapping operation. There is no need to explicitly specify a value for the pin function index in each instruction of the program. By executing the pin-mapping operation, the value of the pin function index can be determined based on one or more of the operation data and the latest value of the pin function index stored in pin function register 402. For example, the operation data can be omitted in the instruction. If no update is needed on the pin function index or pin function register 402 at a plurality of test cycles, there will be no need to include operation data for the plurality of test cycles in the program. The pin-mapping operation at the plurality of test cycles can be automatically determined as a noop operation after compilation, and bit fields of the operation data in the instruction can be reused for other purposes. The latest value of the pin function index stored in pin function register 402 can be used as a value (e.g., an updated value) of the pin function index at the plurality of test cycles.

It can be seen that an approach described above with reference to FIGS. 4A-4C can provide more flexibility for program development on testing DUTs. For example, as described above, various ways can be used to determine the value of the pin function index based on the pin-mapping operation, rather than using a single way to explicitly specify the value in the program. In another example, the pin function mapping for pins (or pin function switching for the pins) can be implemented in a higher level of program routines, so that the configuration of the pin function mapping can be separated from specific test sub-routines of the pins as shown in the above example program. Thus, the test sub-routines can focus on waveform generation for testing the pins, and can be easily reused for other situations. In still another example, it can be flexible to extend a range of pin function register 402 without changing related codewords in an instruction (e.g., a range of pin function register 402 may be extended while the bit fields for the pin-mapping operation and the operation data in the instruction can remain unchanged).

Furthermore, with reference to FIGS. 1-4C, processor 108 can be configured to implement part of or all the functionality of pattern generation system 102. For example, processor 108 can be configured to implement part of or all the functionality of pattern generator 114, source selectors 124, or pin function configurator 122 described herein.

In some implementations, processor 108 can be configured to generate the plurality of source patterns. For example, processor 108 can be configured to generate one or more of a control signal pattern, an address pattern, and a data pattern.

In some implementations, processor 108 can be configured to execute a pin-mapping operation included in an instruction to generate the set of source selection signals 204 for the set of test channels 126 based on one or more of: (1) the value of the pin function index stored in pin function register 402; (2) operation data included in the instruction; and (3) lookup table set 302. For example, processor 108 can execute the pin-mapping operation to generate an updated value of the pin function index based on one or more of the operation data and the value of the pin function index. Next, processor 108 can obtain the set of index mapping data 324 from lookup table set 302 based on the updated value of the pin function index, and generate the set of source selection signals 204 based on the set of index mapping data 324. Processor 108 can be further configured to store the updated value of the pin function index in pin function register 402.

In some implementations, processor 108 can be configured to select and output a source signal from the plurality of source patterns for each test channel 126 based on a corresponding source selection signal for the respective test channel 126.

FIG. 5 illustrates a graphic representation 500 of exemplary lookup tables 304, according to some aspects of the present disclosure. Table 1 illustrates an example of lookup table 304A for test channel 126A. Table 2 illustrates an example of lookup table 304N for test channel 126N. The plurality of source patterns include a data pattern (e.g., data bit[0], data bit[1]), a control signal pattern (e.g., CS bit[0], CS bit[1]), and an address pattern (e.g., add. bit[0], add. bit[1]). A value of the pin function index can be 0, 1, 2, 3, 4, or 5. For each column in the tables, a value of 1 in the tables indicates that a corresponding source signal is selected, and a value of 0 in the tables indicates that a corresponding source signal is not selected. For example, when the value of the pin function index for a test cycle is 2, a first source signal (CS bit[0]) is selected for test channel 126A based on Table 1, and a second source signal (data bit[0]) is selected for test channel 126N based on Table 2.

Figure 6:
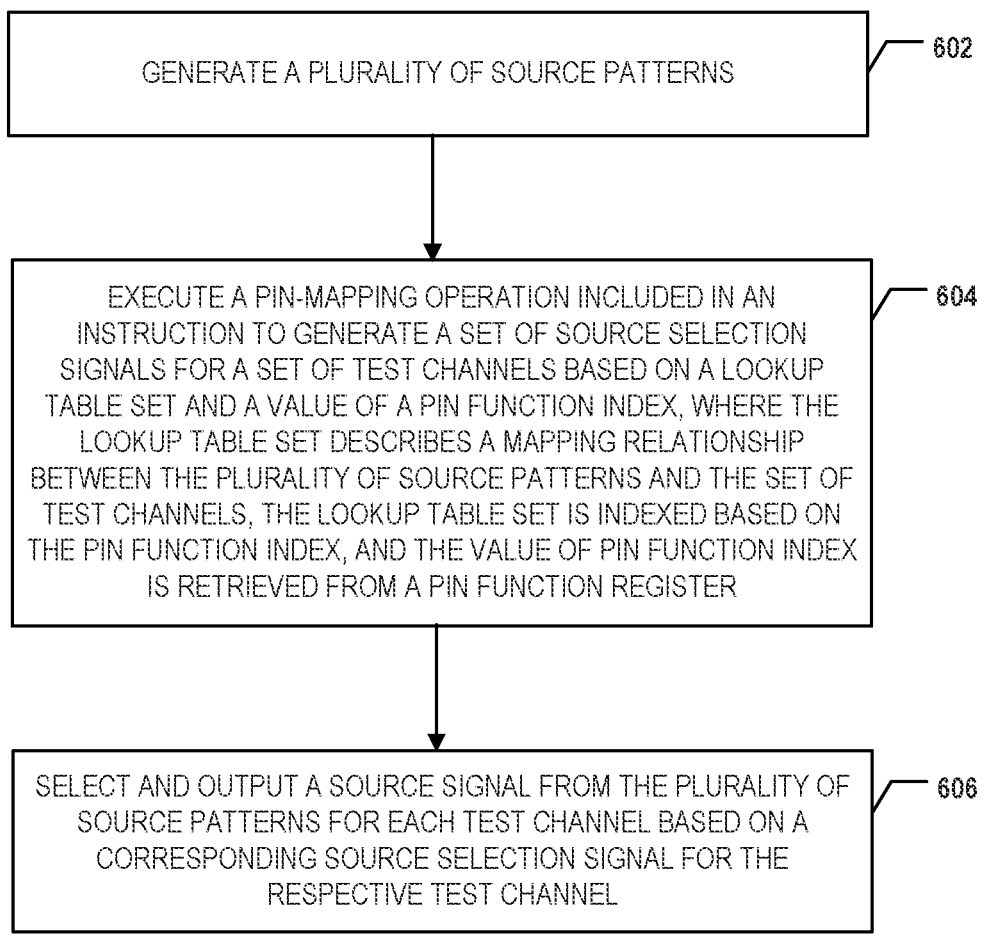
FIG. 6 illustrates a flowchart of a method for providing source signals to test channels, according to some aspects of the present disclosure.

FIG. 6 illustrates a flowchart of a method 600 for providing source signals to test channels 126, according to some aspects of the present disclosure. Method 600 may be implemented by components of pattern generation system 102. In some implementations, method 600 may be performed by processor 108. It is understood that the operations shown in method 600 may not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a plurality of source patterns are generated. The plurality of source patterns may include one or more of a control signal pattern, an address pattern, and a data pattern. For example, pattern generator 114 can generate the plurality of source patterns. In another example, processor 108 can be configured to generate the plurality of source patterns.

Method 600 proceeds to operation 604, as illustrated in FIG. 6, in which a pin-mapping operation included in an instruction is executed to generate a set of source selection signals for the set of test channels 126 based on lookup table set 302 and a value of a pin function index. Lookup table set 302 may describe a mapping relationship between the plurality of source patterns and the set of test channels 126. Lookup table set 302 can be indexed based on the pin function index. The value of the pin function index can be retrieved from pin function register 402. In some implementations, the value of the pin function index can be a latest value of the pin function index that is obtained from a previous test cycle and stored in pin function register 402.

For example, pin function mapper 410 can execute the pin-mapping operation to generate an updated value of the pin function index based on the value of the pin function index stored in pin function register 402, obtain a set of index mapping data from lookup table set 302 based on the updated value of the pin function index, and generate the set of source selection signals based on the set of index mapping data. In another example, processor 108 can be configured to execute the pin-mapping operation to generate the set of source selection signals for the set of test channels 126.

Method 600 proceeds to operation 606, as illustrated in FIG. 6, in which a source signal from the plurality of source patterns is selected and outputted for each test channel 126 based on a corresponding source selection signal for the respective test channel 126. For example, each source selector 124 can select a source signal for test channel 126 based on a corresponding source selection signal. In another example, processor 108 can be configured to select and output a source signal from the plurality of source patterns for each test channel 126.

According to one aspect of the present disclosure, a pattern generation system includes a pattern generator, a memory, a pin function register, a pin function mapper, and a set of source selectors. The pattern generator is configured to generate a plurality of source patterns. The memory is configured to store a lookup table set. The lookup table set describes a mapping relationship between the plurality of source patterns and a set of test channels, and is indexed based on a pin function index. The pin function register is configured to store a value of the pin function index. The pin function mapper is coupled to the memory and the pin function register, and is configured to execute a pin-mapping operation included in an instruction to generate a set of source selection signals based on the value of the pin function index and the lookup table set. The set of source selectors is coupled to the pattern generator, the pin function mapper, and the set of test channels. Each source selector is configured to select and output a source signal from the plurality of source patterns to a corresponding test channel based on a corresponding source selection signal received from the pin function mapper.

In some implementations, the pin function mapper includes operation logic that is configured to execute the pin-mapping operation.

In some implementations, the operation logic includes an adder.

In some implementations, the pin function mapper is implemented using a PLD.

In some implementations, the PLD includes an FPGA.

In some implementations, the pattern generator includes a programmable logic device, and the set of source selectors includes a set of multiplexers.

In some implementations, to execute the pin-mapping operation to generate the set of source selection signals, the pin function mapper is configured to execute the pin-mapping operation to generate an updated value of the pin function index based on the value of the pin function index stored in the pin function register; obtain a set of index mapping data from the lookup table set based on the updated value of the pin function index; and generate a set of source selection signals based on the set of index mapping data.

In some implementations, the pin function mapper is further configured to store the updated value of the pin function index in the pin function register.

In some implementations, the instruction further includes operation data, and the pin function mapper is further configured to execute the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

According to another aspect of the present disclosure, a pattern generation system includes a memory, a pin function register, and a processor. The memory is configured to store a lookup table set. The lookup table set describes a mapping relationship between a plurality of source patterns and a set of test channels, and is indexed based on a pin function index. The pin function register is configured to store a value of the pin function index. The processor is configured to: generate the plurality of source patterns; execute a pin-mapping operation included in an instruction to generate a set of source selection signals for the set of test channels based on the value of the pin function index and the lookup table set; and select and output a source signal from the plurality of source patterns for each test channel based on a corresponding source selection signal for the respective test channel.

In some implementations, to execute the pin-mapping operation to generate the set of source selection signals, the processor is further configured to execute the pin-mapping operation to generate an updated value of the pin function index based on the value of the pin function index stored in the pin function register; obtain a set of index mapping data from the lookup table set based on the updated value of the pin function index; and generate the set of source selection signals based on the set of index mapping data.

In some implementations, the processor is further configured to store the updated value of the pin function index in the pin function register.

In some implementations, the instruction further includes operation data, and the processor is further configured to execute the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

According to still another aspect of the present disclosure, a method for providing a set of source signals to a set of test channels is provided. A plurality of source patterns are generated. A pin-mapping operation included in an instruction is executed to generate a set of source selection signals for the set of test channels based on a lookup table set and a value of a pin function index. The lookup table set describes a mapping relationship between the plurality of source patterns and the set of test channels. The lookup table set is indexed based on the pin function index. The value of the pin function index is retrieved from a pin function register. A source signal from the plurality of source patterns is selected and outputted for each test channel based on a corresponding source selection signal for the respective test channel.

In some implementations, executing the pin-mapping operation to generate the set of source selection signals includes: executing the pin-mapping operation to generate an updated value of the pin function index based on the value of the pin function index stored in the pin function register; obtaining a set of index mapping data from the lookup table set based on the updated value of the pin function index; and generating the set of source selection signals based on the set of index mapping data.

In some implementations, the updated value of the pin function index is stored in the pin function register.

In some implementations, the instruction further includes operation data, and executing the pin-mapping operation to generate the updated value of the pin function index includes executing the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

According to yet another aspect of the present disclosure, a test equipment is provided. The test equipment includes a set of test channels and a pattern generation system. The set of test channels is configured to drive a set of pins of a DUT. The pattern generation system includes a pattern generator, a memory, a pin function register, a pin function mapper, and a set of source selectors. The pattern generator is configured to generate a plurality of source patterns. The memory is configured to store a lookup table set. The lookup table set describes a mapping relationship between the plurality of source patterns and the set of test channels, and is indexed based on a pin function index. The pin function register is configured to store a value of the pin function index. The pin function mapper is coupled to the memory and the pin function register, and is configured to execute a pin-mapping operation included in an instruction to generate a set of source selection signals based on the value of the pin function index and the lookup table set. The set of source selectors is coupled to the pattern generator, the pin function mapper, and the set of test channels. Each source selector is configured to select and output a source signal from the plurality of source patterns to a corresponding test channel based on a corresponding source selection signal received from the pin function mapper.

In some implementations, the pin function mapper includes operation logic that is configured to execute the pin-mapping operation.

In some implementations, the operation logic includes an adder.

In some implementations, the pin function mapper is implemented using a PLD.

In some implementations, the PLD includes an FPGA.

In some implementations, the pattern generator includes a programmable logic device, and the set of source selectors includes a set of multiplexers.

In some implementations, to execute the pin-mapping operation to generate the set of source selection signals, the pin function mapper is configured to: execute the pin-mapping operation to generate an updated value of the pin function index based on the value of the pin function index stored in the pin function register; obtain a set of index mapping data from the lookup table set based on the updated value of the pin function index; and generate a set of source selection signals based on the set of index mapping data.

In some implementations, the pin function mapper is further configured to store the updated value of the pin function index in the pin function register.

In some implementations, the instruction further includes operation data, and the pin function mapper is further configured to execute the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

According to yet another aspect of the present disclosure, a test equipment is provided. The test equipment includes a set of test channels and a pattern generation system. The set of test channels is configured to drive a set of pins of a DUT. The pattern generation system includes a memory, a pin function register, and a processor. The memory is configured to store a lookup table set. The lookup table set describes a mapping relationship between a plurality of source patterns and the set of test channels, and is indexed based on a pin function index. The pin function register is configured to store a value of the pin function index. The processor is configured to: generate the plurality of source patterns; execute a pin-mapping operation included in an instruction to generate a set of source selection signals for the set of test channels based on the value of the pin function index and the lookup table set; and select and output a source signal from the plurality of source patterns for each test channel based on a corresponding source selection signal for the respective test channel.

In some implementations, to execute the pin-mapping operation to generate the set of source selection signals, the processor is further configured to: execute the pin-mapping operation to generate an updated value of the pin function index based on the value of the pin function index stored in the pin function register; obtain a set of index mapping data from the lookup table set based on the updated value of the pin function index; and generate the set of source selection signals based on the set of index mapping data.

In some implementations, the processor is further configured to store the updated value of the pin function index in the pin function register.

In some implementations, the instruction further includes operation data, and the processor is further configured to execute the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

According to yet another aspect of the present disclosure, a computer-readable storage medium configured to store program instructions which, in response to an execution by a processor, cause the processor to perform a process is provided. The process includes: generating a plurality of source patterns; executing a pin-mapping operation included in an instruction to generate a set of source selection signals for a set of test channels based on a lookup table set and a value of a pin function index, where the lookup table set describes a mapping relationship between the plurality of source patterns and the set of test channels, the lookup table set is indexed based on the pin function index, and the value of the pin function index is retrieved from a pin function register; and selecting and outputting a source signal from the plurality of source patterns for each test channel based on a corresponding source selection signal for the respective test channel.

In some implementations, to execute the pin-mapping operation to generate the set of source selection signals, the program instructions cause the processor to perform the process further including: executing the pin-mapping operation to generate an updated value of the pin function index based on the value of the pin function index stored in the pin function register; obtaining a set of index mapping data from the lookup table set based on the updated value of the pin function index; and generating the set of source selection signals based on the set of index mapping data.

In some implementations, the program instructions cause the processor to perform the process further including storing the updated value of the pin function index in the pin function register.

In some implementations, the instruction further includes operation data, and to execute the pin-mapping operation to generate the updated value of the pin function index, the program instructions cause the processor to perform the process further including executing the pin-mapping operation to generate the updated value of the pin function index based on the operation data and the value of the pin function index stored in the pin function register.

In some implementations, the lookup table set includes a set of lookup tables, each lookup table is indexed based on the pin function index, and each lookup table stores data describing a mapping relationship between the plurality of source patterns and a test channel that corresponds to the respective lookup table.

In some implementations, the pin-mapping operation includes a load operation, an addition operation, a subtraction operation, an increment operation, or a noop operation.

In some implementations, the plurality of source patterns include a control signal pattern, an address pattern, and a data pattern.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A pattern generation system comprising:
a pattern generator configured to generate a plurality of source patterns;
a memory configured to store a lookup table set, wherein the lookup table set describes a mapping relationship between the plurality of source patterns and a set of test channels, and is indexed based on a pin function index;
a pin function register configured to store a value of the pin function index;
a pin function mapper coupled to the memory and the pin function register, and configured to execute a pin-mapping operation included in an instruction to generate a set of source selection signals based on the value of the pin function index and the lookup table set; and
a set of source selectors coupled to the pattern generator, the pin function mapper, and the set of test channels, wherein each source selector is configured to select and output a source signal from the plurality of source patterns to a corresponding test channel based on a corresponding source selection signal received from the pin function mapper.

2. The pattern generation system of claim 1, wherein the pin function mapper comprises operation logic that is configured to execute the pin-mapping operation.

3. The pattern generation system of claim 2, wherein the operation logic comprises an adder.

4. The pattern generation system of claim 1, wherein the pin function mapper is implemented using a programmable logic device (PLD).

5. The pattern generation system of claim 4, wherein the PLD comprises a field-programmable gate array (FPGA).

6. The pattern generation system of claim 1, wherein the pattern generator comprises a programmable logic device, and the set of source selectors comprises a set of multiplexers.

7. The pattern generation system of claim 1, wherein to execute the pin-mapping operation to generate the set of source selection signals, the pin function mapper is configured to:
execute the pin-mapping operation to generate an updated value of the pin function index based on the value of the pin function index stored in the pin function register;
obtain a set of index mapping data from the lookup table set based on the updated value of the pin function index; and
generate a set of source selection signals based on the set of index mapping data.

8. The pattern generation system of claim 7, wherein the pin function mapper is further configured to store the updated value of the pin function index in the pin function register.

9. The pattern generation system of claim 7, wherein the instruction further comprises operation data, and the pin function mapper is further configured to execute the pin-mapping operation to generate the updated value of the pin function index based on the operation data and the value of the pin function index stored in the pin function register.

10. The pattern generation system of claim 1, wherein the lookup table set comprises a set of lookup tables, each lookup table is indexed based on the pin function index, and each lookup table stores data describing a mapping relationship between the plurality of source patterns and a test channel that corresponds to the respective lookup table.

11. The pattern generation system of claim 1, wherein the pin-mapping operation comprises a load operation, an addition operation, a subtraction operation, an increment operation, or a noop operation.

12. The pattern generation system of claim 1, wherein the plurality of source patterns comprise a control signal pattern, an address pattern, and a data pattern.

13. A pattern generation system comprising:
a memory configured to store a lookup table set, wherein the lookup table set describes a mapping relationship between a plurality of source patterns and a set of test channels, and is indexed based on a pin function index;
a pin function register configured to store a value of the pin function index; and a processor configured to:
generate the plurality of source patterns;
execute a pin-mapping operation included in an instruction to generate a set of source selection signals for the set of test channels based on the value of the pin function index and the lookup table set; and
select and output a source signal from the plurality of source patterns for each test channel based on a corresponding source selection signal for the respective test channel.

14. The pattern generation system of claim 13, wherein to execute the pin-mapping operation to generate the set of source selection signals, the processor is further configured to:
execute the pin-mapping operation to generate an updated value of the pin function index based on the value of the pin function index stored in the pin function register;
obtain a set of index mapping data from the lookup table set based on the updated value of the pin function index; and
generate the set of source selection signals based on the set of index mapping data.

15. The pattern generation system of claim 14, wherein the processor is further configured to store the updated value of the pin function index in the pin function register.

16. A method for providing a set of source signals to a set of test channels, comprising:
generating a plurality of source patterns;
executing a pin-mapping operation included in an instruction to generate a set of source selection signals for the set of test channels based on a lookup table set and a value of a pin function index, wherein the lookup table set describes a mapping relationship between the plurality of source patterns and the set of test channels, the lookup table set is indexed based on the pin function index, and the value of the pin function index is retrieved from a pin function register; and
selecting and outputting a source signal from the plurality of source patterns for each test channel based on a corresponding source selection signal for the respective test channel.

17. The method of claim 16, wherein executing the pin-mapping operation to generate the set of source selection signals comprises:
executing the pin-mapping operation to generate an updated value of the pin function index based on the value of the pin function index stored in the pin function register;
obtaining a set of index mapping data from the lookup table set based on the updated value of the pin function index; and
generating the set of source selection signals based on the set of index mapping data.

18. The method of claim 17, further comprising storing the updated value of the pin function index in the pin function register.

19. The method of claim 17, wherein the instruction further comprises operation data, and executing the pin-mapping operation to generate the updated value of the pin function index comprises executing the pin-mapping operation to generate the updated value of the pin function index based on the operation data and the value of the pin function index stored in the pin function register.

20. The method of claim 17, wherein the lookup table set comprises a set of lookup tables, each lookup table is indexed based on the pin function index, and each lookup table stores data describing a mapping relationship between the plurality of source patterns and a test channel that corresponds to the respective lookup table.

* * * * *